US009847322B2

(12) United States Patent
Sung et al.

(10) Patent No.: US 9,847,322 B2
(45) Date of Patent: Dec. 19, 2017

(54) SEMICONDUCTOR PACKAGES INCLUDING THROUGH MOLD BALL CONNECTORS AND METHODS OF MANUFACTURING THE SAME

(71) Applicant: SK hynix Inc., Icheon-si, Gyeonggi-do (KR)

(72) Inventors: Ki Jun Sung, Cheongju-si (KR); Jong Hoon Kim, Suwon-si (KR); Yeon Seung Jung, Suwon-si (KR); Hyeong Seok Choi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/400,341

(22) Filed: Jan. 6, 2017

(65) Prior Publication Data

US 2017/0338205 A1 Nov. 23, 2017

(30) Foreign Application Priority Data

May 18, 2016 (KR) .................. 10-2016-0061098

(51) Int. Cl.
*H01L 23/495* (2006.01)
*H01L 25/065* (2006.01)
*H01L 23/498* (2006.01)
*H01L 23/367* (2006.01)

(52) U.S. Cl.
CPC ........ *H01L 25/0657* (2013.01); *H01L 23/367* (2013.01); *H01L 23/49816* (2013.01); *H01L 2225/0652* (2013.01); *H01L 2225/06517* (2013.01)

(58) Field of Classification Search
CPC ... C09K 11/025; C09K 11/06; H01L 51/5012; H01L 51/0072; H01L 51/56
USPC ............................................. 257/668
See application file for complete search history.

(56) References Cited

U.S. PATENT DOCUMENTS

| 7,170,788 | B1* | 1/2007 | Wan .................. G11C 11/5628 365/185.14 |
| 2004/0056344 | A1* | 3/2004 | Ogawa ............... H01L 23/3121 257/686 |
| 2013/0256917 | A1* | 10/2013 | Kim ....................... H01L 24/46 257/777 |
| 2014/0042608 | A1* | 2/2014 | Kim ....................... H01L 23/04 257/686 |
| 2015/0235915 | A1 | 8/2015 | Liang et al. |

FOREIGN PATENT DOCUMENTS

| KR | 1020040060843 A | 7/2004 |
| KR | 20140022255 A | 2/2014 |

* cited by examiner

*Primary Examiner* — Andy Huynh
(74) *Attorney, Agent, or Firm* — William Park & Associates Ltd.

(57) ABSTRACT

There is provided a structure and a method of manufacturing a semiconductor package. The method includes disposing a first semiconductor device and through mold ball connectors (TMBCs) on a first surface of an interconnection structure layer, recessing a molding layer on the first surface of the interconnection structure layer to expose a portion of each of the TMBCs, attaching outer connectors to the exposed portions of the TMBCs, and mounting a second semiconductor device on a second surface of the interconnection structure layer opposite to the molding layer.

14 Claims, 24 Drawing Sheets

SEMICONDUCTOR PACKAGES INCLUDING THROUGH MOLD BALL CONNECTORS AND METHODS OF MANUFACTURING THE SAME

CROSS-REFERENCE TO RELATED APPLICATIONS

The present application claims priority under 35 U.S.C 119(a) to Korean Patent Application No. 10-2016-0061098, filed on May 18, 2016, which is incorporated herein by reference in its entirety.

BACKGROUND

1. Technical Field

Embodiments of the present disclosure relate to semiconductor packages and, more particularly, to semiconductor packages including through mold ball connectors and methods of manufacturing the same.

2. Related Art

In the electronics industry, a single unified package including a plurality of semiconductor devices is increasingly in demand with the development of multi-functional, larger storage capacity and smaller electronic systems or products. The single unified package may be designed to reduce a total size of the package and to have various functions. The single unified package may be realized to include a plurality of semiconductor chips having different functions. This is for processing a large amount of data at a time. A system-in-package (SIP) has been proposed to provide the single unified package. For example, a lot of effort has been focused on integrating at least one microprocessor and at least one memory chip in a single system-in-package.

SUMMARY

According to an embodiment, there is provided a method of manufacturing a semiconductor package. The method includes forming an interconnection structure layer including conductive trace patterns and a dielectric layer on a dummy wafer, attaching a carrier wafer to a second surface of the interconnection structure layer opposite to the dummy wafer, removing the dummy wafer to expose a first surface of the interconnection structure layer opposite to the carrier wafer, mounting at least one first semiconductor device and through mold ball connectors (TMBCs) on the first surface of the interconnection structure layer, recessing a molding layer on the first surface of the interconnection structure layer to expose a portion of each of the through mold ball connectors (TMBCs), respectively attaching outer connectors to the exposed portions of the through mold ball connectors (TMBCs), removing the carrier wafer to expose the second surface of the interconnection structure layer, and mounting a second semiconductor device on the second surface of the interconnection structure layer.

According to another embodiment, there is provided a method of manufacturing a semiconductor package. The method includes mounting a first semiconductor device and through mold ball connectors (TMBCs) on a first surface of an interconnection structure layer, recessing a molding layer on the first surface of the interconnection structure layer to expose a portion of each of the through mold ball connectors (TMBCs), respectively attaching outer connectors to the exposed portions of the through mold ball connectors (TMBCs), and mounting a second semiconductor device on a second surface of the interconnection structure layer opposite to the first semiconductor device.

According to another embodiment, a semiconductor package includes a first semiconductor device disposed on a first surface of an interconnection structure layer, through mold ball connectors (TMBCs) disposed on the first surface of the interconnection structure layer to be adjacent to the first semiconductor device, a molding layer disposed on the first surface of the interconnection structure layer to expose a portion of each of the through mold ball connectors (TMBCs), respectively outer connectors attached to the exposed portions of the through mold ball connectors (TMBCs), and a second semiconductor device disposed on a second surface of the interconnection structure layer opposite to the first semiconductor device. Each of the through mold ball connectors (TMBCs) includes a copper ball.

According to another embodiment, there is provided a memory card including a semiconductor package. The semiconductor package includes a first semiconductor device disposed on a first surface of an interconnection structure layer, through mold ball connectors (TMBCs) disposed on the first surface of the interconnection structure layer to be adjacent to the first semiconductor device, a molding layer disposed on the first surface of the interconnection structure layer to expose a portion of each of the through mold ball connectors (TMBCs), respectively outer connectors attached to the exposed portions of the through mold ball connectors (TMBCs), and a second semiconductor device disposed on a second surface of the interconnection structure layer opposite to the first semiconductor device. Each of the through mold ball connectors (TMBCs) includes a copper ball.

According to another embodiment, there is provided an electronic system including a semiconductor package. The semiconductor package includes a first semiconductor device disposed on a first surface of an interconnection structure layer, through mold ball connectors (TMBCs) disposed on the first surface of the interconnection structure layer to be adjacent to the first semiconductor device, a molding layer disposed on the first surface of the interconnection structure layer to expose a portion of each of the through mold ball connectors (TMBCs), respectively outer connectors attached to the exposed portions of the through mold ball connectors (TMBCs), and a second semiconductor device disposed on a second surface of the interconnection structure layer opposite to the first semiconductor device. Each of the through mold ball connectors (TMBCs) includes a copper ball.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
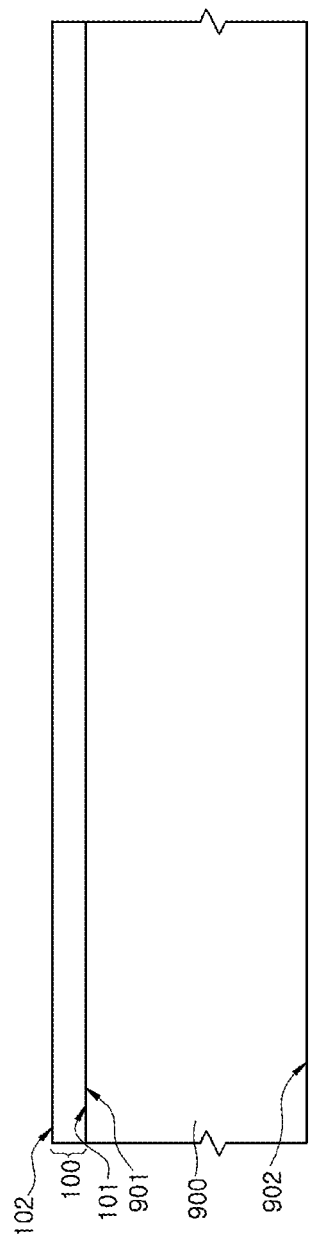
FIGS. 1 to 19 are cross-sectional views illustrating a method of manufacturing a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence.

Semiconductor packages according to the following embodiments may correspond to system-in-packages (SIPs). Each of the semiconductor packages may be realized to include a plurality of semiconductor devices, at least two of which are designed to have different functions. The semiconductor devices may be obtained by separating a semiconductor substrate such as a wafer including electronic circuits into a plurality of pieces (having semiconductor die shapes or semiconductor chip shapes) using a die sawing process. Alternatively, each of the semiconductor devices may have a package form including a package substrate and a semiconductor die mounted on the package substrate. Each of the semiconductor devices may include a plurality of semiconductor dice which are vertically stacked to have a three-dimensional structure, and the plurality of semiconductor dice may be electrically connected to each other by silicon through vias (TSVs) penetrating the plurality of semiconductor dice. The semiconductor dice may correspond to memory chips including dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The semiconductor chips or the semiconductor packages may be employed in communication systems such as mobile phones, electronic systems associated with biotechnology or health care, or wearable electronic systems.

In some embodiments, the semiconductor chip may correspond to a logic chip having a system-on-chip (SoC) form. The SoC may be an application specific integrated circuit (ASIC) chip including a microprocessor, a microcontroller, a digital signal processing core or an interface. The SoC may include a central processing unit (CPU) or a graphics processing unit (GPU). In order that the SoC operates at a high speed, the SoC has to communicate with a memory chip storing data at a high speed. That is, a short interface path and a high signal bandwidth may be required to improve an operation speed of the SoC. For example, if a GPU chip and a high bandwidth memory (HBM) chip are vertically stacked in a single SIP, an interface path between the GPU chip and the HBM chip may be reduced to improve an operation speed of the GPU chip.

In an electronic system, a bottleneck phenomenon in communication between a memory chip and a processor chip may degrade the performance of the electronic system. Accordingly, high performance memory chips such as HBM chips may be employed as memory chips of the electronic systems. The HBM chip may be configured to include a plurality of memory dice which are vertically stacked using a TSV technique to obtain a high bandwidth thereof. The HBM chip may include a plurality of TSVs connected to each of the memory dice to independently control the respective memory dice which are vertically stacked. Each of the memory dice may be configured to include two memory channels, and a plurality of TSVs, for example, one hundred and twenty eight TSVs acting as input/output (I/O) pins may be required for operation of each memory channel. Accordingly, an HBM chip comprised of four stacked memory dice may include one thousand and twenty four TSVs to independently control eight memory channels. In such a case, one of the eight memory channels may independently communicate with another one of the eight memory channels through the TSVs. Thus, a signal bandwidth of the HBM chip may be broadened because each memory channel independently and directly receives or outputs signals through the TSVs.

However, if the number of the TSVs increases to improve the bandwidth of the HBM chip, a pitch size of interconnection lines or pads included in the HBM chip may be reduced. Therefore, the following embodiments provide various SIPs having a configuration that electrically connects the memory chip to the ASIC chip using an interconnection structure layer realized with a wafer processing technique which is capable of forming fine patterns.

The same reference numerals refer to the same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIGS. 1 to 19 are cross-sectional views illustrating a method of manufacturing a semiconductor package according to an embodiment.

FIG. 1 illustrates a step of forming an interconnection structure layer 100 on a dummy wafer 900. The dummy wafer 900 may be a wafer having a first surface 901 and a second surface 902 which are opposite to each other. The interconnection structure layer 100 may be formed on the first surface 901 of the dummy wafer 900. The interconnection structure layer 100 may be formed using a silicon processing technique or a semiconductor processing technique. The interconnection structure layer 100 may be formed by sequentially or alternately stacking a plurality of dielectric layers and a plurality of conductive layers. In such a case, each of the conductive layers included in the interconnection structure layer 100 may be patterned after it is stacked. The interconnection structure layer 100 may be formed to have a first surface 101 that faces and contacts the first surface 901 of the dummy wafer 900 and to have a second surface 102 which is opposite to the dummy wafer 900. A multi-layered interconnection structure may be disposed in the interconnection structure layer 100 to electrically connect some members disposed on the first surface 101 of the interconnection structure layer 100 to each other. The interconnection structure layer 100 may be formed to include a plurality of stacked dielectric layers that electrically insulate or physically separate conductive trace patterns from each other.

The dummy wafer 900 may be used as a supporter or a substrate when the interconnection structure layer 100 is formed. The dummy wafer 900 may be a silicon wafer which may be bare. Alternatively, the dummy wafer 900 may be a non-semiconductor wafer. For example, the dummy wafer 900 may be a wafer including an insulation material or a dielectric material. In some embodiments, the dummy wafer 900 may be a sapphire wafer or a silicon on insulator (SOI) wafer. If a bare silicon wafer is used as the dummy wafer 900, the interconnection structure layer 100 may be formed using semiconductor wafer processing apparatuses and semiconductor wafer processing techniques.

Although processes for forming the interconnection structure layer 100 are described hereinafter in conjunction with wafer processing techniques, the present disclosure is not limited thereto. For example, the interconnection structure layer 100 may be formed by changing or modifying a process sequence or pattern shapes used in the following embodiments. The dummy wafer 900 may provide the first surface 901 having a flat surface profile. Thus, the interconnection structure layer 100 may be formed to include conductive trace patterns having a fine pitch.

Figure 2:
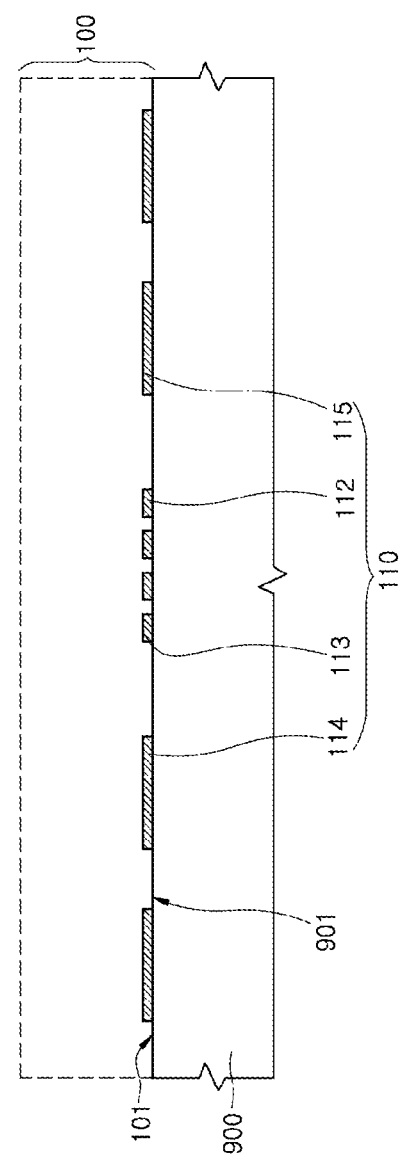
Figure 3:
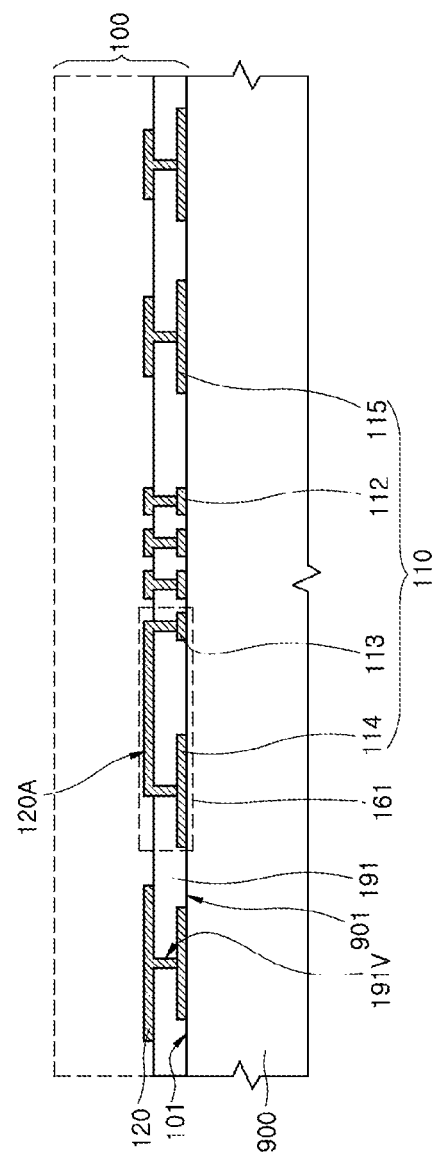
Figure 4:
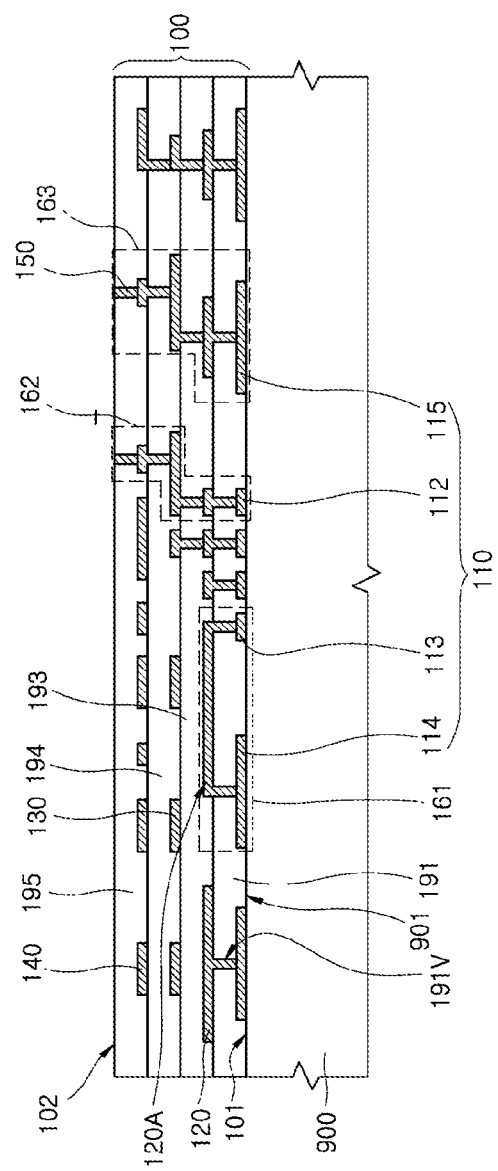

FIGS. 2 to 4 are enlarged views illustrating a portion of the interconnection structure layer 100 and illustrating a step of forming the interconnection structure layer 100. As illustrated in FIG. 2, first outer conductive trace patterns 110 may be formed on the first surface 901 of the dummy wafer 900. Specifically, a conductive layer such as a metal layer may be formed on the first surface 901 of the dummy wafer 900, and the conductive layer may be patterned using a photolithography process and an etch process to form the first outer conductive trace patterns 110. The first outer conductive trace patterns 110 may be formed of a copper (Cu) layer or an aluminum (Al) layer.

The first outer conductive trace patterns 110 may correspond to some of interconnection lines included in the interconnection structure layer 100. The first outer conductive trace patterns 110 may be formed to have pad shapes. The first outer conductive trace patterns 110 may include first patterns 112 and second patterns 113 having substantially the same shape as the first patterns 112. The first and second patterns 112 and 113 of the first outer conductive trace patterns 110 may be connected to a first semiconductor device which is disposed as later described. The first outer conductive trace patterns 110 may further include third patterns 114 and fourth patterns 115 having substantially the same shape as the third patterns 114. The third and fourth patterns 114 and 115 of the first outer conductive trace patterns 110 may be connected to outer connectors such as solder balls which are disposed as later described. The third and fourth patterns 114 and 115 of the first outer conductive trace patterns 110 may be formed to have a pitch (or a width) which is greater than a pitch (or a width) of the first and second patterns 112 and 113 of the first outer conductive trace patterns 110. Even though a pitch of the third and fourth patterns 114 and 115 is different from a pitch of the first and second patterns 112 and 113, all of the first outer conductive trace patterns 110 may be patterned to have relatively finer pitches as compared with a case that printed circuit patterns are formed on a general printed circuit board (PCB) because a surface flatness of the dummy wafer 900 is more well defined than that of the PCB.

As illustrated in FIG. 3, a first dielectric layer 191 may be formed on the first surface 901 of the dummy wafer 900 to cover and insulate the first outer conductive trace patterns 110 from each other. The first dielectric layer 191 may be formed to include at least one of various dielectric materials. For example, the first dielectric layer 191 may be formed of an interlayer dielectric (ILD) layer or an inter-metal dielectric (IMD) layer comprised of a silicon oxide layer, a silicon nitride layer, or a polymer layer such as a polyimide layer. The first dielectric layer 191 may be formed using a lamination process, a deposition process or a coating process.

First inner conductive trace patterns 120 may be formed on the first dielectric layer 191. The first inner conductive trace patterns 120 may be formed to provide routes for the first outer conductive trace patterns 110. For example, the first inner conductive trace patterns 120 may be formed to be electrically connected to the first outer conductive trace patterns 110 through vias 191v that substantially penetrate the first dielectric layer 191. A first pattern 120A corresponding to one of the first inner conductive trace patterns 120 may be formed to act as a horizontal interconnection portion 161 electrically connecting the second pattern 113 of the first outer conductive trace patterns 110 to the third pattern 114 of the first outer conductive trace patterns 110.

As illustrated in FIG. 4, a second dielectric layer 193 may be formed on the first dielectric layer 191 to cover and insulate the first inner conductive trace patterns 120 from each other. The second dielectric layer 193 may be formed to include at least one of various dielectric materials. Second inner conductive trace patterns 130 may be formed on the second dielectric layer 193. The second inner conductive trace patterns 130 may be formed to provide routes for the first inner conductive trace patterns 120. Some of the second inner conductive trace patterns 130 may be formed to be electrically connected to some of the first inner conductive trace patterns 120 through vias that substantially penetrate the second dielectric layer 193.

A third dielectric layer 194 may be formed on the second dielectric layer 193 to cover and insulate the second inner conductive trace patterns 130 from each other. The third dielectric layer 194 may be formed to include at least one of various dielectric materials. Third inner conductive trace patterns 140 may be formed on the third dielectric layer 194. The third inner conductive trace patterns 140 may be formed to provide routes of the second inner conductive trace patterns 130. Some of the third inner conductive trace patterns 140 may be formed to be electrically connected to some of the second inner conductive trace patterns 130 through vias that substantially penetrate the third dielectric layer 194.

A fourth dielectric layer 195 may be formed on the third dielectric layer 194 to cover and insulate the third inner conductive trace patterns 140 from each other. The fourth dielectric layer 195 may be formed to include at least one of various dielectric materials. Second outer conductive trace patterns 150 may be formed to penetrate the fourth dielectric layer 195. The second outer conductive trace patterns 150 may be electrically connected to some of the third inner conductive trace patterns 140, respectively. One of the first inner conductive trace patterns 120, one of the second inner conductive trace patterns 130, and one of the third inner conductive trace patterns 140 may constitute a first vertical interconnection portion 162 that electrically connects one of the first patterns 112 of the first outer conductive trace patterns 110 to one of the second outer conductive trace patterns 150. Another one of the first inner conductive trace patterns 120, another one of the second inner conductive trace patterns 130, and another one of the third inner conductive trace patterns 140 may constitute a second vertical interconnection portion 163 that electrically connects one of the fourth patterns 115 of the first outer conductive trace patterns 110 to one of the second outer conductive trace patterns 150.

The first to fourth dielectric layers 191, 193, 194 and 195 may constitute a body of the interconnection structure layer 100 that insulates the trace patterns 110, 120, 130, 140 and 150 from each other.

Figure 5:
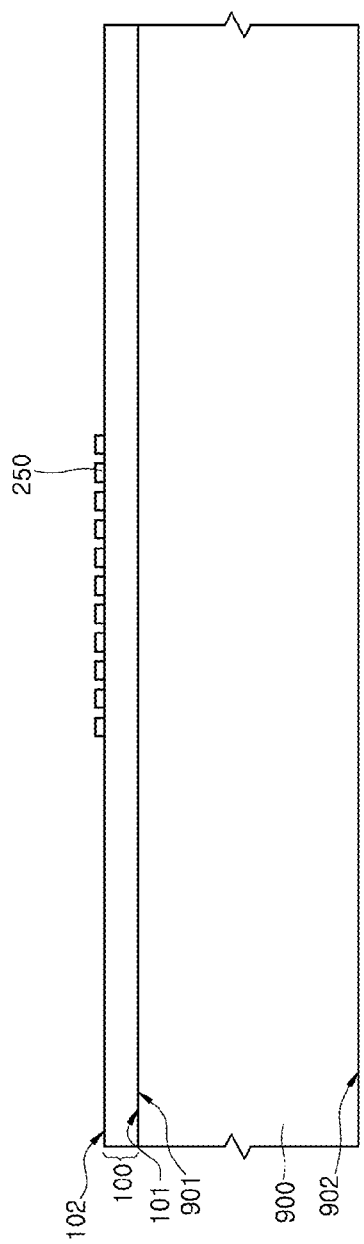
Figure 6:
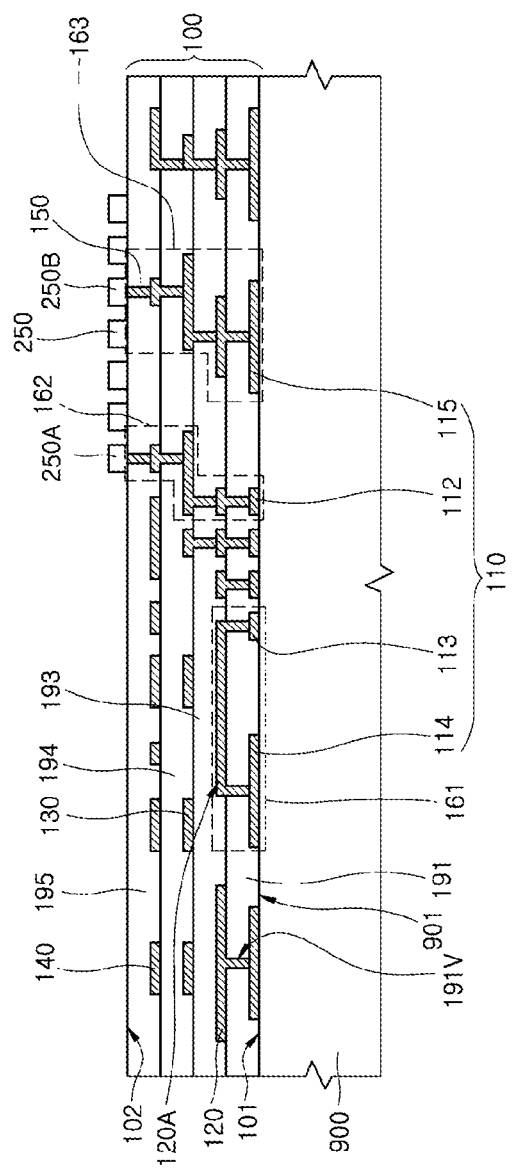

FIG. 5 illustrates a step of forming first bump pads 250 on the second surface 102 of the interconnection structure layer 100, and FIG. 6 is an enlarged view illustrating a portion of the interconnection structure layer 100 shown in FIG. 5. As illustrated in FIGS. 5 and 6, the first bump pads 250 may be formed on the interconnection structure layer 100. The first bump pads 250 may be pads on which connectors such as bumps are landed as later described. The first bump pads 250 may be formed to overlap with the second outer conductive trace patterns 150. The first bump pads 250 may be electrically connected to the second outer conductive trace patterns 150, respectively. One pad 250A of the first bump pads 250 may be electrically connected to the first vertical interconnection portion 162, and another pad 250B of the first bump pads 250 may be electrically connected to the second vertical interconnection portion 163. The first bump pads 250 may be formed using a plating process. The first bump pads 250 may be formed to include copper (Cu).

Figure 7:
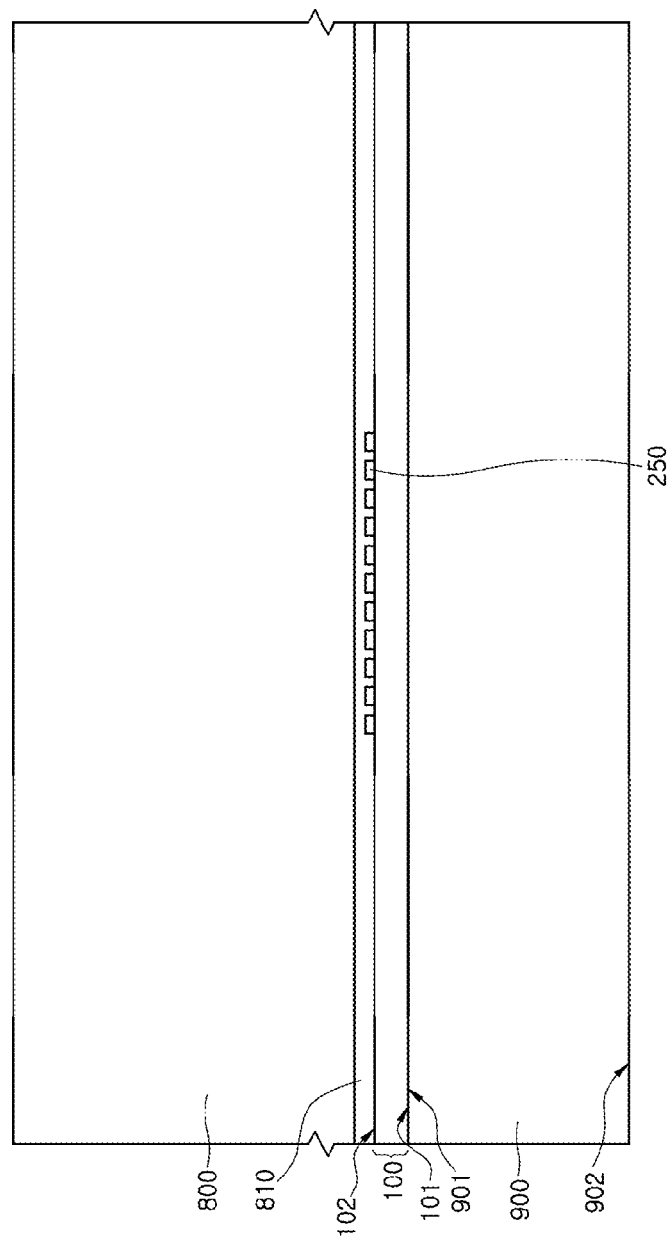

FIG. 7 is a cross-sectional view illustrating a step of attaching a carrier wafer 800 to the second surface 102 of the interconnection structure layer 100 opposite to the dummy wafer 900. In one example, the first bump pads 250 on the second surface 102 of the interconnection structure layer 100 may be formed before the carrier wafer 800 is attached to the second surface 102 of the interconnection structure layer 100. The carrier wafer 800 may be bonded to the interconnection structure layer 100 using a temporary adhesive layer 810 to protect the first bump pads 250. The carrier wafer 800 may act as a supporter for handling the interconnection structure layer 100 in subsequent processes.

Figure 8:
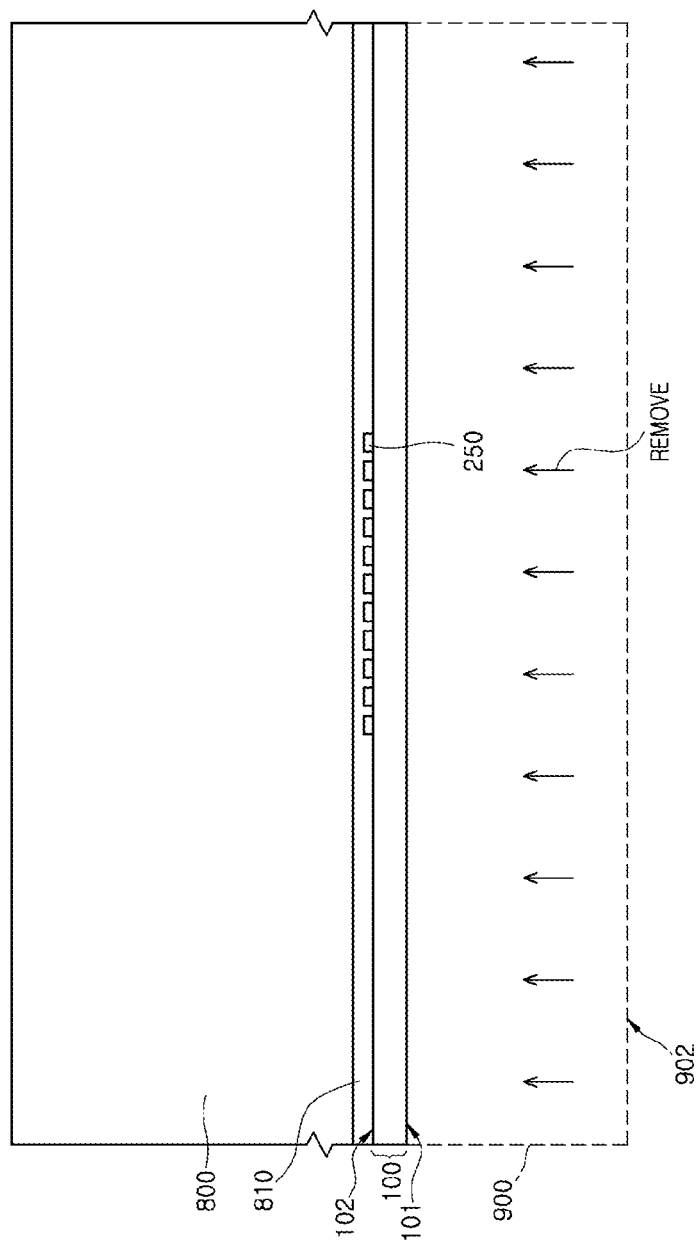

FIG. 8 is a cross-sectional view illustrating a step of exposing the first surface 101 of the interconnection structure layer 100. Specifically, the dummy wafer 900 may be removed from the interconnection structure layer 100 to expose the first surface 101 of the interconnection structure layer 100 opposite to the carrier wafer 800. More specifically, the dummy wafer 900 may be ground to reduce a thickness of the dummy wafer 900, and the remaining portion of the dummy wafer 900 may be etched to expose the first surface 101 of the interconnection structure layer 100. As a result, the interconnection structure layer 100 may be separated from the dummy wafer 900 by grinding and etching the dummy wafer 900.

Figure 9:
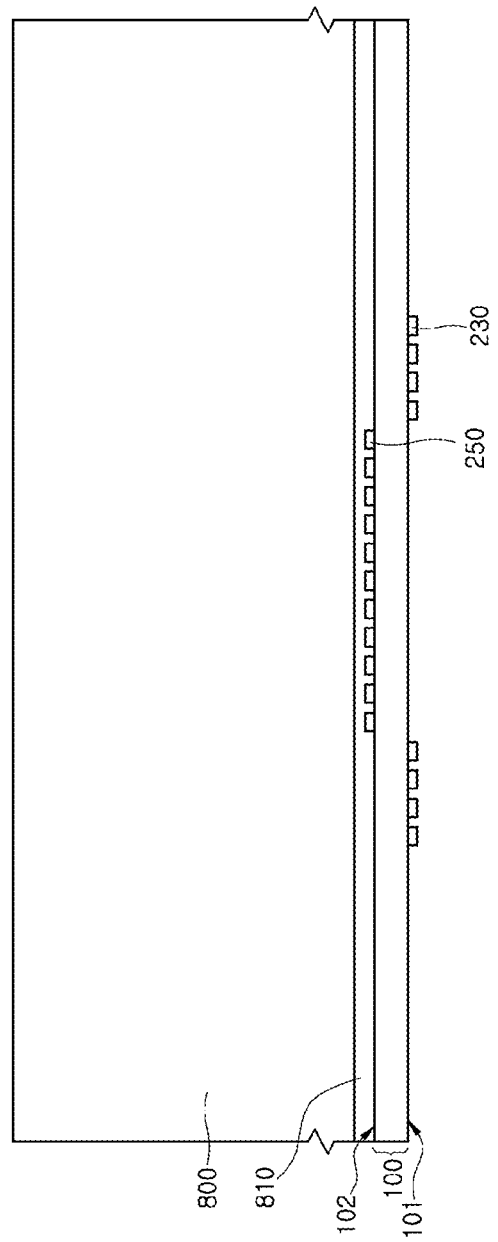
Figure 10:
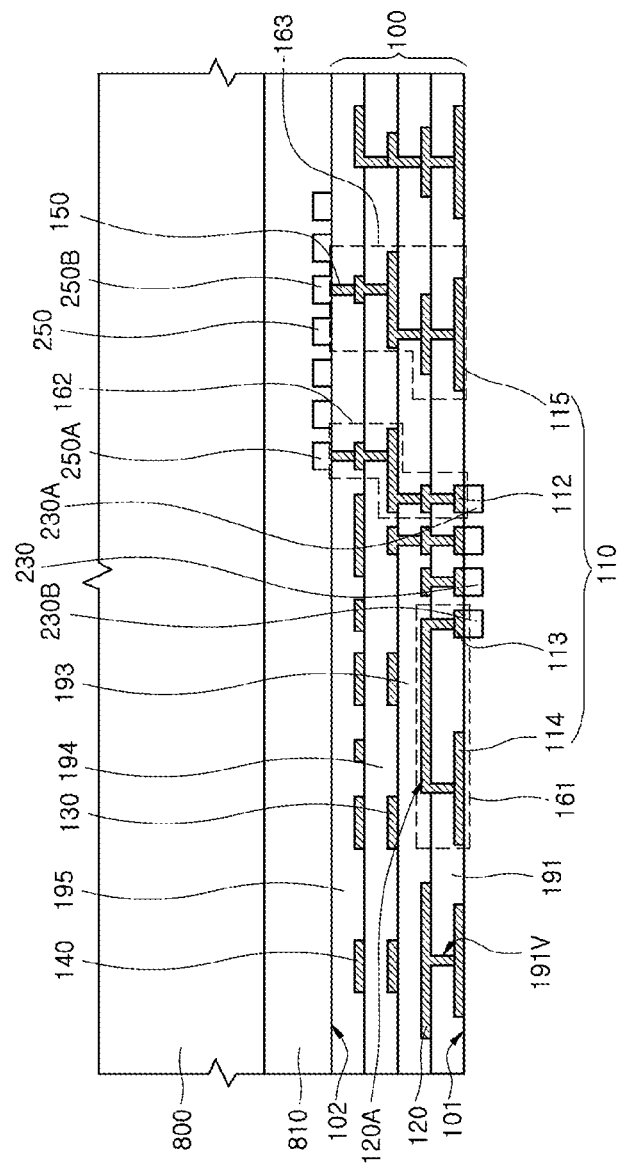

FIG. 9 is a cross-sectional view illustrating a step of forming second bump pads 230 on the first surface 101 of the interconnection structure layer 100, and FIG. 10 is an enlarged view of a portion of the interconnection structure layer 100 shown in FIG. 9. As illustrated in FIGS. 9 and 10, the second bump pads 230 may be formed on the first surface 101 of the interconnection structure layer 100. Connectors such as bumps may be landed on and bonded to the second bump pads 230 in a subsequent process. The second bump pads 230 may be formed to overlap with the first and second patterns 112 and 113 of the first outer conductive trace patterns 110, respectively. The second bump pads 230 may be electrically connected to the first and second patterns 112 and 113, respectively. One pad 230A of the second bump pads 230 may be electrically connected to the first vertical interconnection portion 162, and another pad 230B of the second bump pads 230 may be electrically connected to the horizontal interconnection portion 161. The second bump pads 230 may be formed by plating a copper material.

Figure 11:
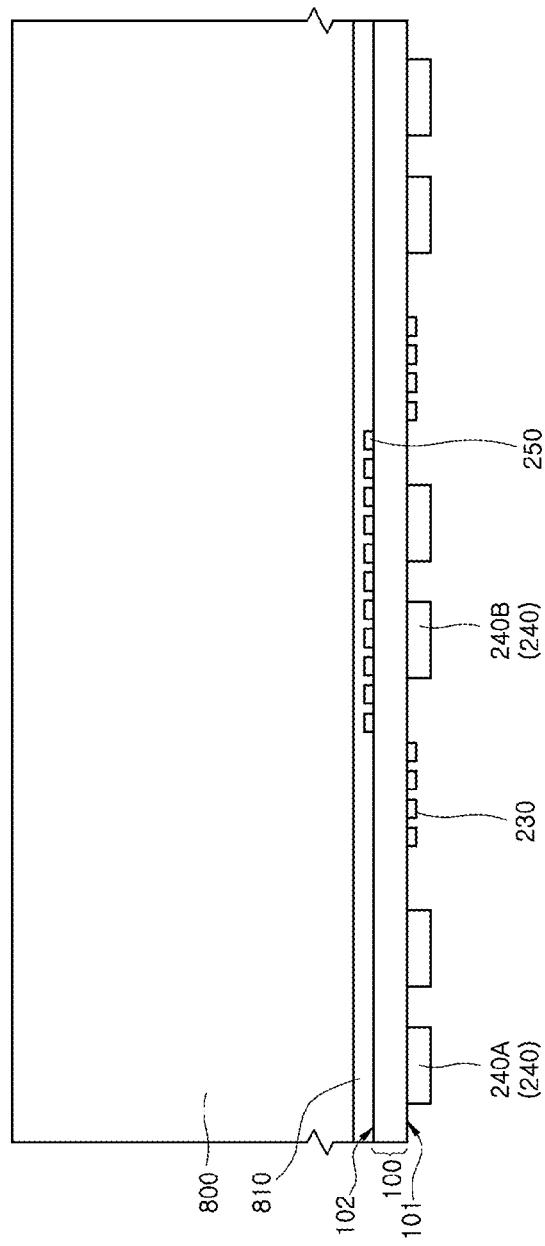
Figure 12:
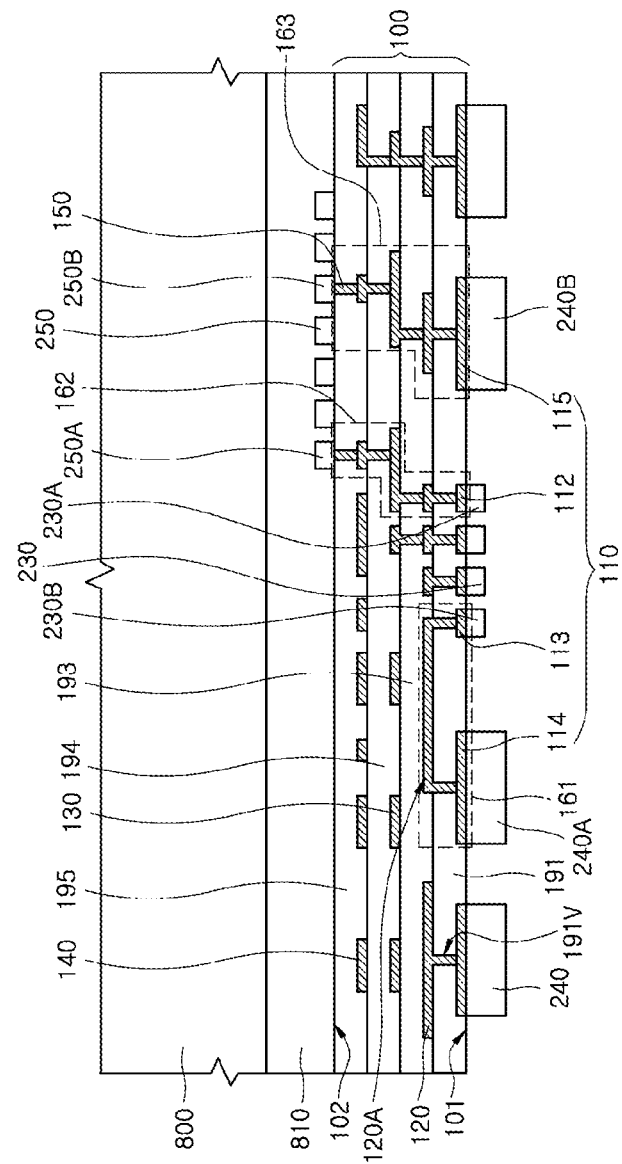

FIG. 11 is a cross-sectional view illustrating a step of forming third bump pads 240 on the first surface 101 of the interconnection structure layer 100, and FIG. 12 is an enlarged view of a portion of the interconnection structure layer 100 shown in FIG. 11. As illustrated in FIGS. 11 and 12, the third bump pads 240 may be formed on the first surface 101 of the interconnection structure layer 100. The third bump pads 240 may be formed to have a pitch which is different from a pitch of the second bump pads 230. For example, the third bump pads 240 may be formed to have a pitch which is greater than a pitch of the second bump pads 230. The third bump pads 240 may be formed having a conductive layer with a thickness which is different from a thickness of the second bump pads 230. For example, the third bump pads 240 may be formed to include a copper layer having a thickness which is greater than a thickness of the second bump pads 230.

The third bump pads 240 may be formed to overlap with the third and fourth patterns 114 and 115 of the first outer conductive trace patterns 110, respectively. The third bump pads 240 may be electrically connected to the third and fourth patterns 114 and 115, respectively. One pad 240A of the third bump pads 240 may be electrically connected to the horizontal interconnection portion 161, and another pad 240B of the third bump pads 240 may be electrically connected to the second vertical interconnection portion 163. The third bump pads 240 may be formed by plating a copper material.

Figure 13:
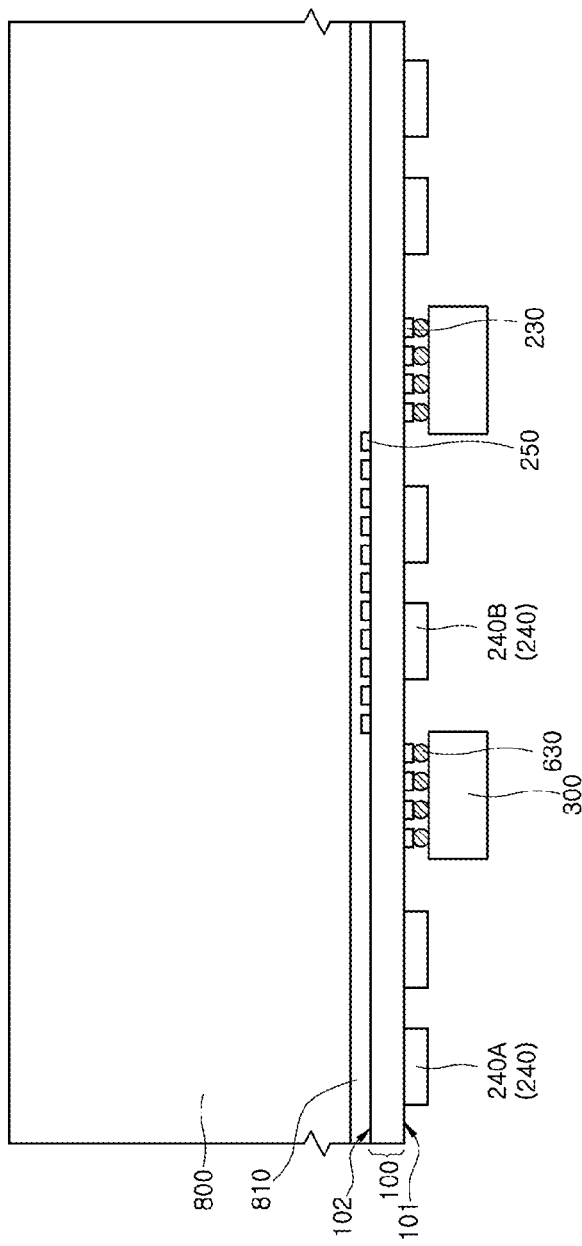

FIG. 13 is a cross-sectional view illustrating a step of mounting at least one first semiconductor device 300 on the first surface 101 of the interconnection structure layer 100. The first semiconductor devices 300 may be bonded to the second bump pads 230 using first chip connectors 630. The first chip connectors 630 may be conductive connection members such as micro-bumps. One of the first semiconductor devices 300 may be electrically connected to the pads 240A of the third bump pads 240. For example, one of the first semiconductor devices 300 may be electrically connected to the third bump pads 240 through one of the first chip connectors 630, one (230B of FIG. 12) of the second bump pads 230, and the horizontal interconnection portion (161 of FIG. 12). The horizontal interconnection portion (161 of FIG. 12) may be comprised of one of the second patterns 113 of the first outer conductive trace patterns 110, the first pattern (120A of FIG. 12) of the first inner conductive trace patterns 120, and one of the third patterns 114 of the first outer conductive trace patterns 110. At least one of the first semiconductor devices 300 may be electrically connected to one or more pads of the first bump pads 250. At least one of the first semiconductor devices 300 may be electrically connected to one or more pads of the first bump pads 250 through one of the first chip connectors 630, another one (230A of FIG. 12) of the second bump pads 230, and the first vertical interconnection portion (162 of FIG. 12). The first semiconductor devices 300 may be memory devices. For example, the first semiconductor devices 300 may be DRAM devices.

Figure 14:
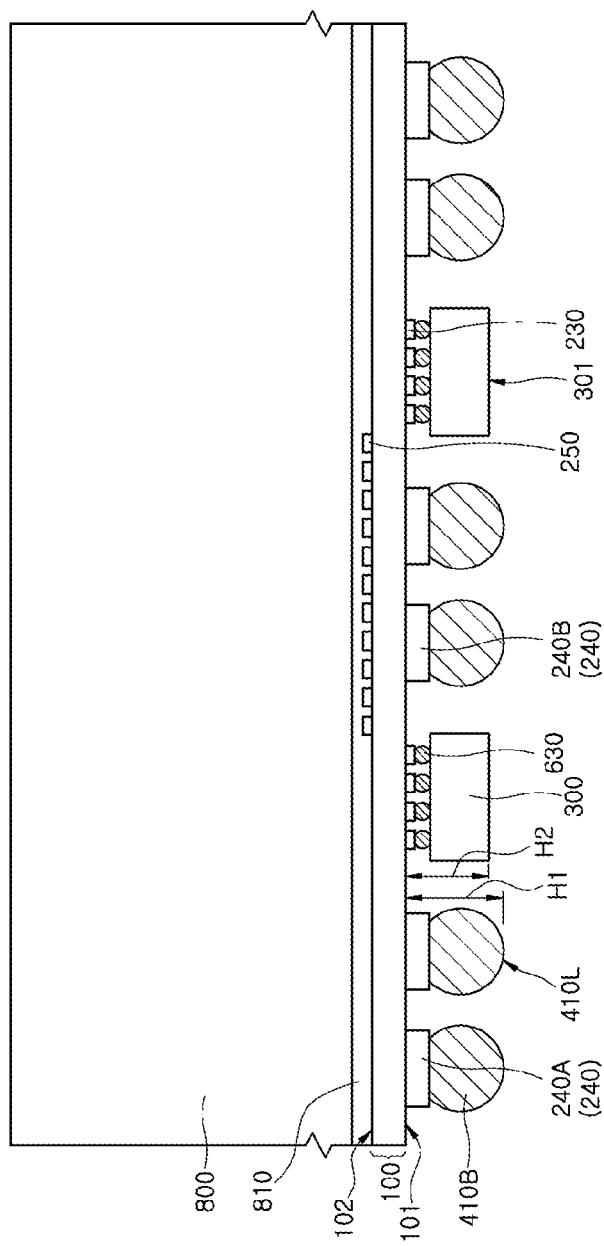

FIG. 14 is a cross-sectional view illustrating a step of mounting at least one through mold ball connector (TMBCs) 410B on the first surface 101 of the interconnection structure layer 100. Specifically, the TMBCs 410B may be attached to the third bump pads 240, respectively. Each of the TMBCs 410B may have a ball shape, for example, a copper ball shape. A solder ball containing tin (Sn) has a low melting point of about 220 degrees Celsius. Thus, the tin (Sn) based solder balls may be inappropriate for the TMBCs 410B. Copper balls may have a melting point which is higher than a melting point of the tin (Sn) based solder balls. Thus, the copper balls may be appropriate for the TMBCs 410B. In addition, the copper balls may have an electrical conductivity which is higher than an electrical conductivity of the tin (Sn) based solder balls. Thus, the copper balls may be more appropriate for the TMBCs 410B. The copper balls coated with a solder layer that may be picked and placed on the third bump pads 240, respectively. Subsequently, the copper balls may be bonded to the third bump pads 240 using a solder reflow process to provide the TMBCs 410B attached to the third bump pads 240. The solder layer coated on the TMBC 410B copper balls may include a nickel solder layer or a nickel layer. The nickel solder layer may be, for example, a nickel-phosphorus (Ni—P) layer. In some other embodiments, a solder layer may be formed on surfaces of the third bump pads 240 without using the copper balls coated with a solder layer, and the solder layer may be reflowed to provide the TMBCs 410B on the third bump pads 240.

A height H1 of the TMBCs 410B from the first surface 101 of the interconnection structure layer 100 may be greater than a height H2 of the first semiconductor devices 300 mounted on the second bump pads 230. In order to set the height H1 which is greater than the height H2, copper balls having a relatively long diameter may be used to form the TMBCs 410B or a thickness of the third bump pads 240 may be increased. As a result, the lower ends 410L of the TMBCs 410B may be located at a level which is lower than surfaces 301 of the first semiconductor devices 300. That is, the TMBCs 410B may downwardly protrude from the first semiconductor devices 300.

Figure 15:
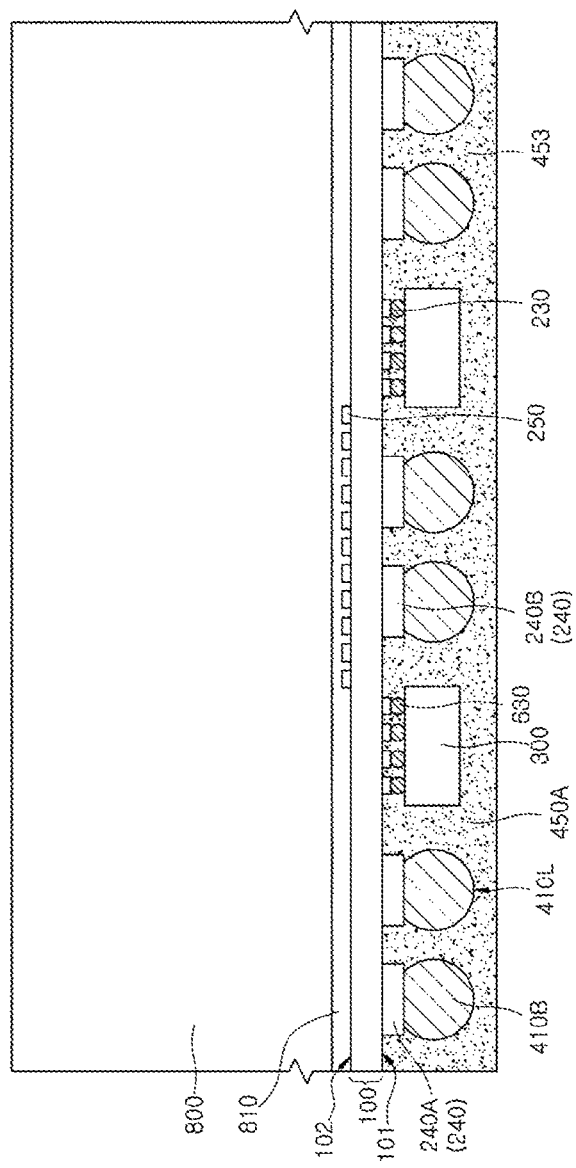

FIG. 15 is a cross-sectional view illustrating a step of forming a molding layer 450A on the first surface 101 of the interconnection structure layer 100. The molding layer 450A may be formed using a wafer molding process to cover the TMBCs 410B and the first semiconductor devices 300. The molding layer 450A may be formed of a molding member such as an epoxy molding compound (EMC) material. For example, the EMC material may be heated up to a molding temperature of about 180 degrees Celsius to provide a liquid EMC material, and the liquid EMC material may be coated and molded on the first surface 101 of the interconnection structure layer 100 to cover the TMBCs 410B and the first semiconductor devices 300. The molded EMC material 453 may be cured by a post mold curing process to form the molding layer 450A. The post mold curing process may be performed at a curing temperature of about 175 degrees Celsius, which is lower than the molding temperature. Since the copper balls of the TMBCs 410B have a melting point which is higher than the molding temperature and the curing temperature, the TMBCs 410B may possibly not be transformed even though the molding process and the post mold curing process are performed. General tin (Sn) based solder balls may have a relatively low melting point. Thus, if the TMBCs 410B are formed of the tin (Sn) based solder balls without using the copper balls, the TMBCs 410B may be transformed during the molding process and the post mold curing process. Accordingly, the TMBCs 410B may be formed using the copper balls instead of the tin (Sn) based solder balls to provide stable ball connectors.

Figure 16:
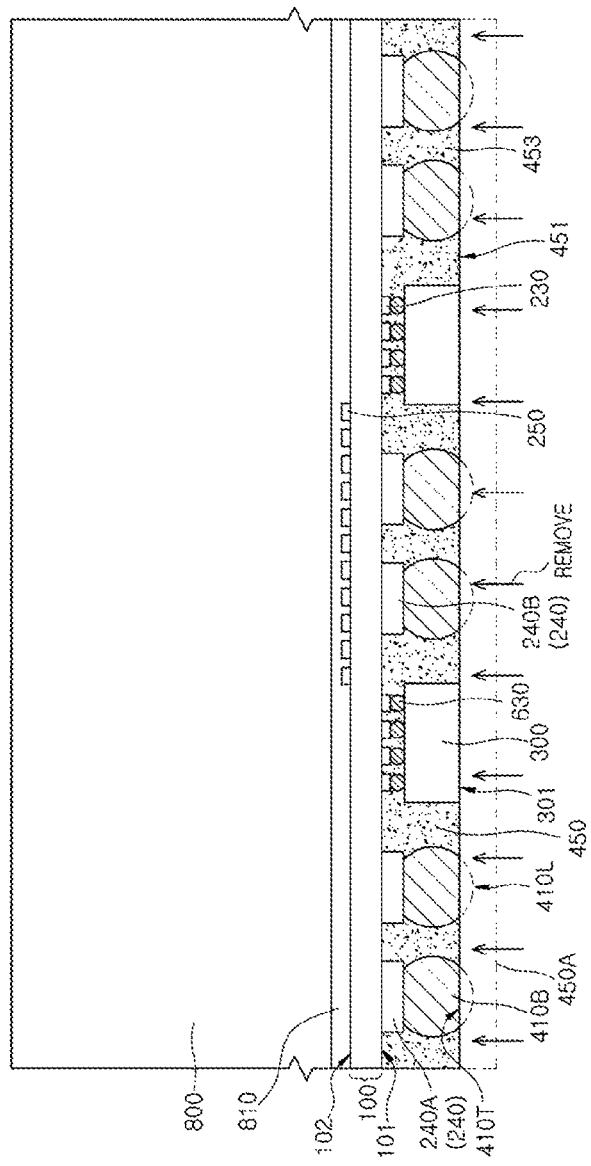

FIG. 16 is a cross-sectional view illustrating a step of exposing surfaces 410T of the TMBCs 410B. Specifically, the molded material 453 comprising the molding layer 450A on the first surface 101 of the interconnection structure layer 100 may be recessed to expose a portion of each of the TMBCs 410B. While the molded material 453 is recessed, the exposed portions of the TMBCs 410B may be removed to provide the exposed and flat surfaces 410T of the TMBCs 410B. The molding layer 450A may be recessed using a grinding process to provide a molding layer 450. In such a case, the lower ends 410L of the TMBCs 410B may be removed during the grinding process. As a result, the surfaces 410T of the TMBCs 410B may be exposed by removing a portion of the molding layer 450A. Since the lower ends 410L of the TMBCs 410B are removed while the molding layer 450A is recessed, the exposed surfaces 410T of the TMBCs 410B may have a flat surface profile. The molded material 453 may be recessed to form the molding layer 450A exposing the surfaces 301 of the first semiconductor devices 300. Since the surfaces 301 of the first semiconductor devices 300 are exposed after the molding layer 450A is recessed, heat generated from the first semiconductor devices 300 may be efficiently radiated into an outside space. While the molding layer 450A is recessed to provide the molding layer 450, the first semiconductor devices 300 may be partially removed so that the exposed surfaces 301 of the first semiconductor devices 300 may be coplanar with a bottom surface 451 of the recessed molding layer 450A. As a result, the exposed surfaces 301 of the first semiconductor devices 300, a bottom surface 451 of the recessed surface of the molding layer 450A, and the exposed and flat surfaces 410T of the TMBCs 410B may be coplanar with each other.

Figure 17:
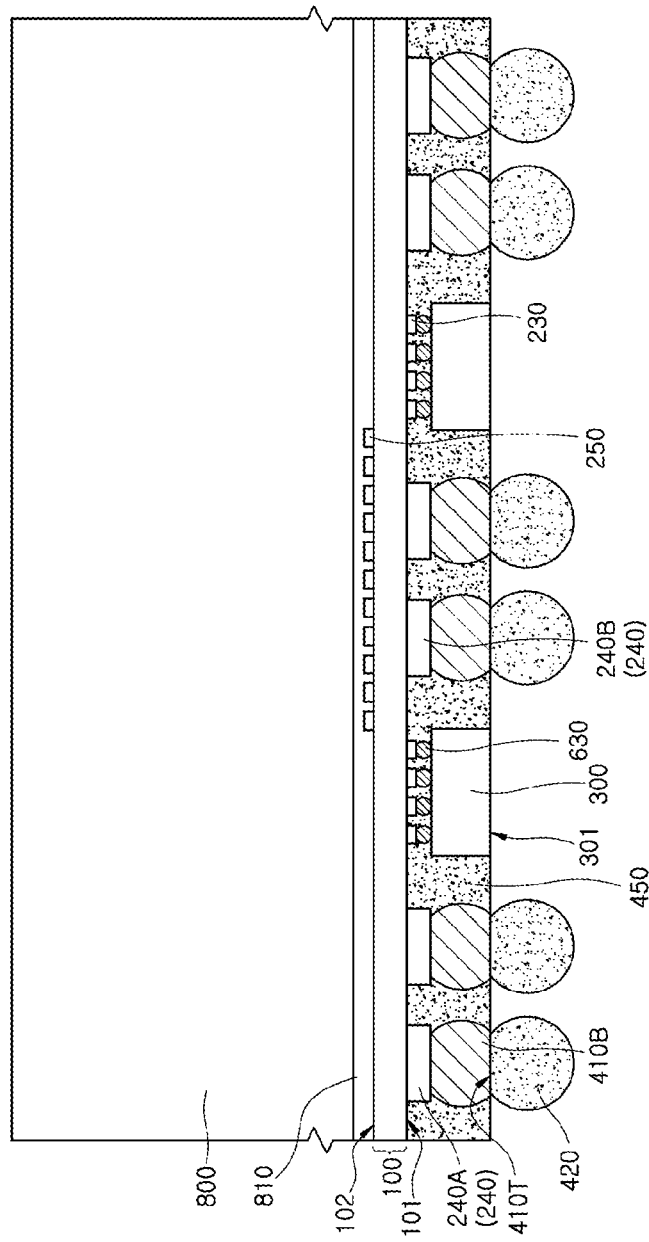

FIG. 17 is a cross-sectional view illustrating a step of forming outer connectors 420 on the TMBCs 410B. The outer connectors 420 may be bonded to the exposed surfaces 410T of the TMBCs 410B, respectively. Each of the outer connectors 420 may have a solder ball shape. The outer connectors 420 may be formed of a tin based solder material including tin (Sn), silver (Ag) and copper (Cu).

Figure 18:
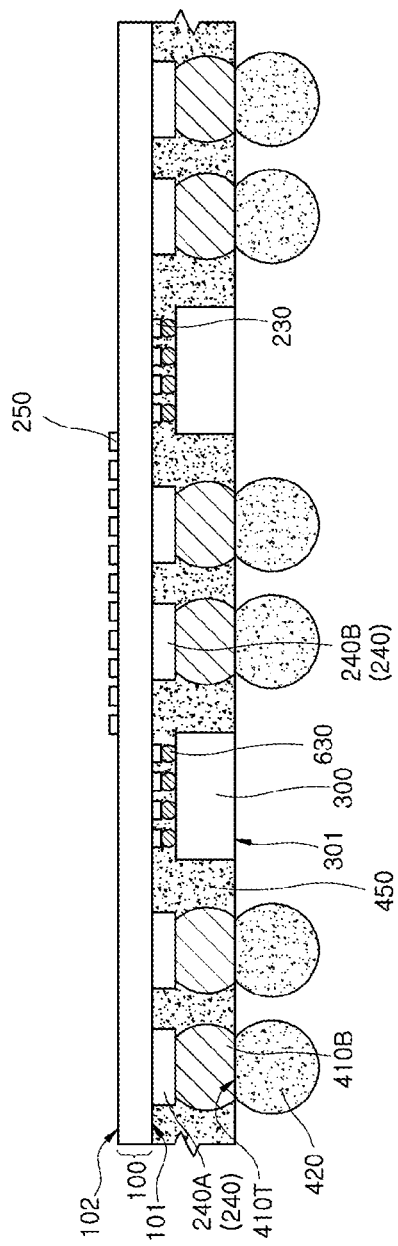

FIG. 18 is a cross-sectional view illustrating a step of detaching the carrier wafer 800 from the interconnection structure layer 100. The carrier wafer 800 may be detached from the interconnection structure layer 100 by reducing an adhesive strength of the temporary adhesive layer (810 of FIG. 17). For example, the carrier wafer 800 may be detached from the interconnection structure layer 100 by irradiating an ultraviolet (UV) ray onto the temporary adhesive layer (810 of FIG. 17) or by applying heat to the temporary adhesive layer (810 of FIG. 17). If the carrier wafer 800 is detached from the interconnection structure layer 100, the second surface 102 of the interconnection structure layer 100 and the first bump pads 250 may be exposed.

Figure 19:
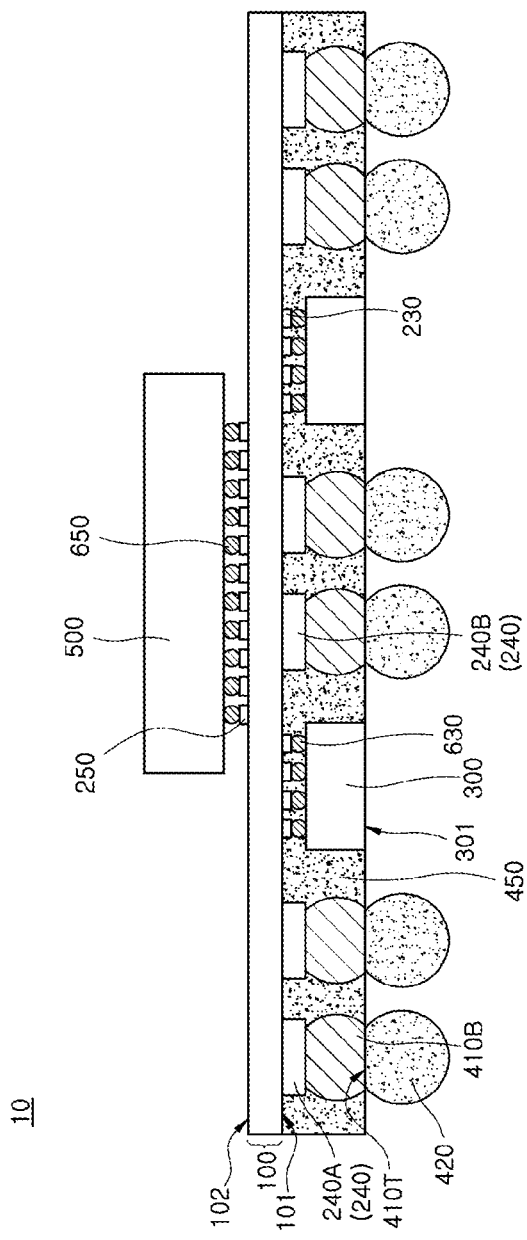

FIG. 19 is a cross-sectional view illustrating a step of disposing a second semiconductor device 500, which may be microprocessor, on the second surface 102 of the interconnection structure layer 100. Specifically, the second semiconductor device 500 may be bonded to the first bump pads 250 using second chip connectors 650. The second chip connectors 650 may be conductive connection members such as micro-bumps. The second semiconductor device 500 may be electrically connected to the first semiconductor devices 300 through the first vertical interconnection portions (162 of FIG. 12). More specifically, the second semiconductor device 500 may be electrically connected to the first semiconductor devices 300 through the second chip connectors 650, some (250A of FIG. 12) of the first bump pad 250, some of the first vertical interconnection portions (162 of FIG. 12) connecting the first patterns 112 of the first outer conductive trace patterns 110 to some of the second outer conductive trace patterns 150, and some (230A of FIG. 12) of the second bump pads 230. The outer connectors 420 may be connected to the second vertical interconnection portions (163 of FIG. 12) which are disposed to vertically overlap the second semiconductor device 500. The second semiconductor device 500 may be electrically connected to some of the outer connectors 420 through other second vertical interconnection portions (163 of FIG. 12) which are disconnected from the first semiconductors 300. More specifically, the second semiconductor device 500 may be electrically connected to some of the outer connectors 420 through some of the second chip connectors 650, some (250A of FIG. 12) of the first bump pad 250, some of the second vertical interconnection portions (163 of FIG. 12) connecting the second patterns 113 of the first outer conductive trace patterns 110 to some of the second outer conductive trace patterns 150, and some (230A of FIG. 12) of the second bump pads 230.

Before the second semiconductor device 500 is bonded to the first bump pads 250, the interconnection structure layer 100 and the molding layer 450 may be separated into a plurality of pieces by a die sawing process. The second semiconductor device 500 may be bonded to the first bump pads 250 of any one piece of the interconnection structure layer 100 to provide a semiconductor package 10 including the first and second semiconductor devices 300 and 500 attached to the first and second surfaces 101 and 102 of the interconnection structure layer 100.

Figure 20:
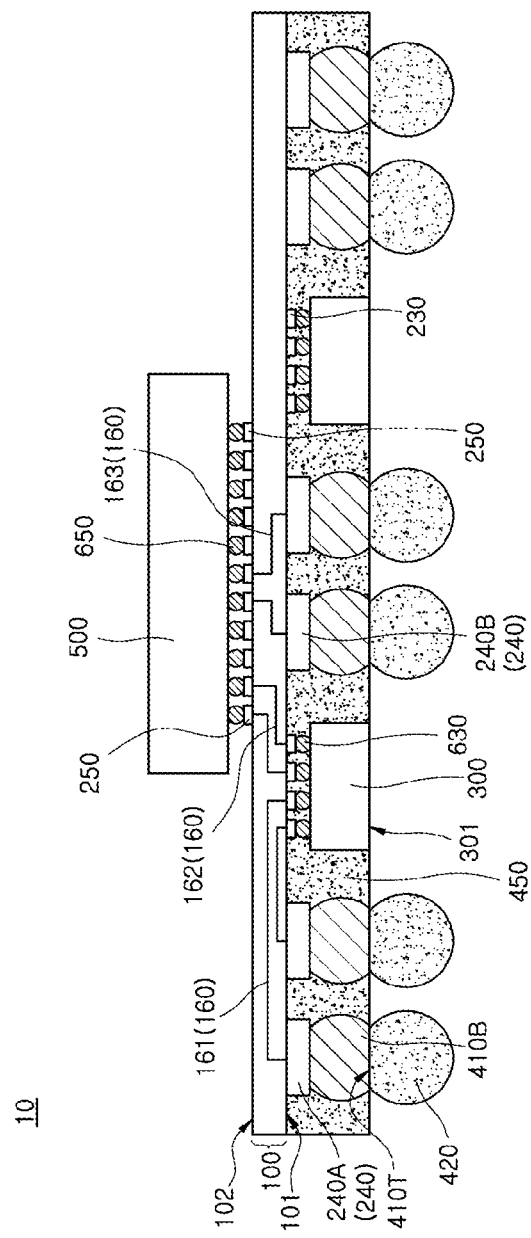
FIG. 20 is a cross-sectional view illustrating a semiconductor package according to an embodiment.
Figure 21:
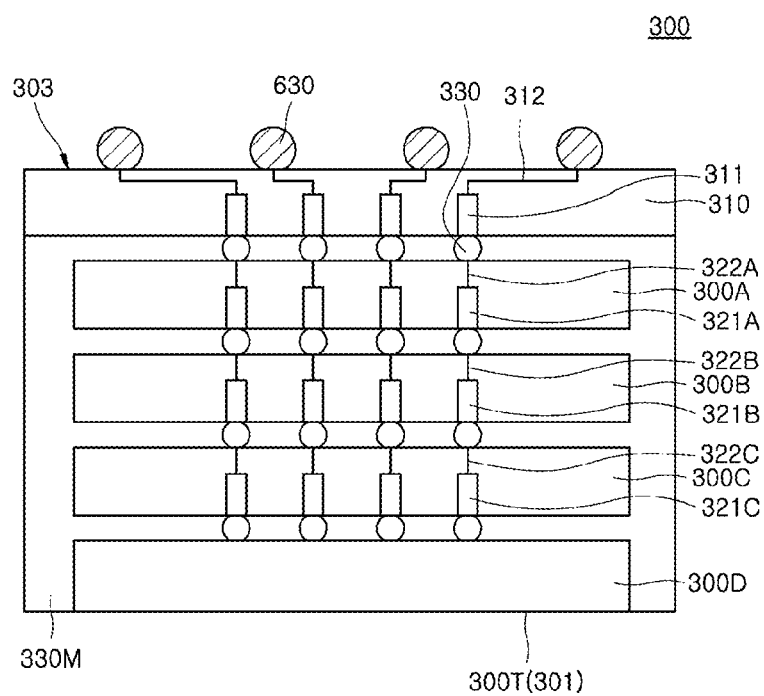
FIG. 21 is a cross-sectional view illustrating a semiconductor device included in the semiconductor package of FIG. 20.

FIG. 20 is a cross-sectional view illustrating a structure of the semiconductor package 10 according to an embodiment. FIG. 21 is a cross-sectional view illustrating one of the first semiconductor devices 300 included in the semiconductor package 10 of FIG. 20. The semiconductor package 10 shown in FIG. 20 may be realized using the fabrication processes described with reference to FIGS. 1 to 19. In the semiconductor package 10, the second semiconductor device 500 may be mounted on the second surface 102 of the interconnection structure layer 100 opposite to the first semiconductor device 300. Since the second semiconductor device 500 is bonded to the first bump pads 250 through the second chip connectors 650 using a soldering process, the second semiconductor device 500 may be mounted on the second surface 102 of the interconnection structure layer 100. The first semiconductor devices 300 may be disposed on the first surface 101 of the interconnection structure layer 100. The first semiconductor devices 300 may be disposed side by side on the first surface 101 of the interconnection structure layer 100. Since the first semiconductor devices 300 are bonded to the second bump pads 230 through the first chip connectors 630 using a soldering process, the first semiconductor devices 300 may be mounted on the first surface 101 of the interconnection structure layer 100.

The second semiconductor device 500 may have a different function from the first semiconductor devices 300, and the first and second semiconductor devices 300 and 500 may constitute a single unified system-in-package (CIP). The second semiconductor device 500 or each of the first semiconductor devices 300 may include a semiconductor substrate (not shown) such as a silicon substrate, active devices (not shown) such as transistors, and interconnection layers. The active devices may be formed on the semiconductor substrate, and the interconnection layers may be formed on the active devices and the semiconductor substrate. The interconnection layers may be formed to include an interlayer dielectric (ILD) layer or an inter-metal dielectric (IMD) layer. The second semiconductor device 500 may be a logic device performing logical operations, and the first semiconductor devices 300 may be memory devices for storing data.

The second semiconductor device may be, for example, a central processing unit (CPU) or a graphic processing unit (GPU). The second semiconductor device 500 may be provided in a chip form or a package form including a molding member that protects a chip. The second semiconductor device 500 may be disposed on the second surface 102 of the interconnection structure layer 100, and the first semiconductor devices 300 may be disposed on the first surface 101 of the interconnection structure layer 100 opposite to the second semiconductor device 500. The second semiconductor device 500 may be vertically stacked on the first semiconductor devices 300. The second semiconductor device 500 may signally communicate with the first semiconductor devices 300 through an interface physical layer (PHY). Since the second semiconductor device 500 is vertically stacked on the first semiconductor devices 300, a length of signal paths between the second semiconductor device 500 and each of the first semiconductor devices 300 may be reduced to improve an operation speed of the semiconductor package 10. If the second semiconductor device 500 includes a GPU and the first semiconductor devices 300 are memory devices, a length of signal paths between the second semiconductor device 500 and each of the first semiconductor devices 300 may be reduced to improve an image data processing speed of the semiconductor package 10 including the GPU.

As illustrated in FIG. 21, the first semiconductor device 300 may include a plurality of semiconductor dice 310, 300A, 300B, 300C and 300D which are vertically stacked. For example, the master die 310, the first slave die 300A, the second slave die 300B, the third slave die 300C and the fourth slave die 300D may be sequentially and downwardly stacked. The plurality of dice 310, 300A, 300B, 300C and 300D may be electrically connected to each other by a through silicon via (TSV) structure including TSVs 311, 321A, 321B and 321C, internal interconnection lines 312, 322A, 322B and 322C, and connection bumps 330. The first semiconductor device 300 may further include side molding part 330M covering sidewalls of the slave dice 300A, 300B, 300C and 300D. A top surface 300T of the fourth slave die 300D opposite to the third slave die 300C may be exposed to improve a heat emission efficiency of the semiconductor package 10. The top surface 300T of the fourth slave die 300D may correspond to the top surface 301 (the lower surface as seen in FIG. 14) of the first semiconductor device 300. A surface 303 of the master die 310 opposite to the slave dice 300A, 300B, 300C and 300D may also be exposed, and the first chip connectors 630 may be attached to the surface 303 of the master die 310. The first semiconductor device 300 including the plurality of semiconductor dice 310, 300A, 300B, 300C and 300D may be a high performance memory device such as a high bandwidth memory (HBM) device.

In the semiconductor package 10, the TMBCs 410B may be disposed on the first surface 101 of the interconnection structure layer 100. The TMBCs 410B may be disposed on the first surface 101 of the interconnection structure layer 100 to be adjacent to the first semiconductor devices 300. In one example, the first and second bump pads (250 and 230 of FIG. 20) may be formed before the first semiconductor device 300 and the TMBCs 410B may be mounted on first surface 101 of the interconnection structure layer 100. Each of the TMBCs 410B may include a copper ball. In some embodiments, each of the TMBCs 410B may include a plurality of copper balls which are vertically stacked to have a pillar shape. The TMBCs 410B may be bonded to the third bump pads 240, respectively. Thus, the TMBCs 410B may be electrically connected to the interconnection structure layer 100 through the third bump pads 240.

In the semiconductor package 10, the molding layer 450 may be provided to cover the first surface 101 of the interconnection structure layer 100 and to fill spaces between the TMBCs 410B and the first semiconductor devices 300. The outer connectors 420 may be attached to the TMBCs 410B, respectively. The TMBCs 410B may substantially penetrate the molding layer 450 to electrically connect the interconnection structure layer 100 to outer connectors 420. The lower surfaces 410T of the TMBCs 410B may be exposed at a bottom surface of the molding layer 450 and may have a flat surface profile. The outer connectors 420 such as solder balls may be more readily attached to the lower surfaces 410T of the TMBCs 410B because the lower surfaces 410T of the TMBCs 410B are flat.

The interconnection structure layer 100 may include the signal paths 160, that is, interconnection portions, disposed in a dielectric body. The interconnection portions 160 may include the horizontal interconnection portions 161, each of which electrically connects one of the second bump pads 230 to one of the third bump pads 240. The interconnection portions 160 may also include the first vertical interconnection portions 162, each of which electrically connects one of the second bump pads 230 to one of the first bump pads 250. In addition, the interconnection portions 160 may further include the second vertical interconnection portions 163, each of which electrically connects one of the third bump pads 240 to one of the first bump pads 250. The horizontal interconnection portions 161 may electrically connect the first semiconductor devices 300 to some of the outer connectors 420, the first vertical interconnection portions 162 may electrically connect the first semiconductor devices 300 to the second semiconductor device 500, and the second vertical interconnection portions 163 may electrically connect the second semiconductor device 500 to some of the outer connectors 420.

The interconnection structure layer 100 of the semiconductor package 10 may be formed by depositing dielectric layers and conductive layers and by patterning the dielectric layers and the conductive layers. Thus, a thickness of the interconnection structure layer 100 may be reduced. This interconnection structure layer 100 may be formed using a fine patterning technique such as a wafer processing technique or a silicon processing technique. Accordingly, the interconnection portions 160 may be formed to include a plurality of interconnection lines having a fine pitch.

Figure 22:
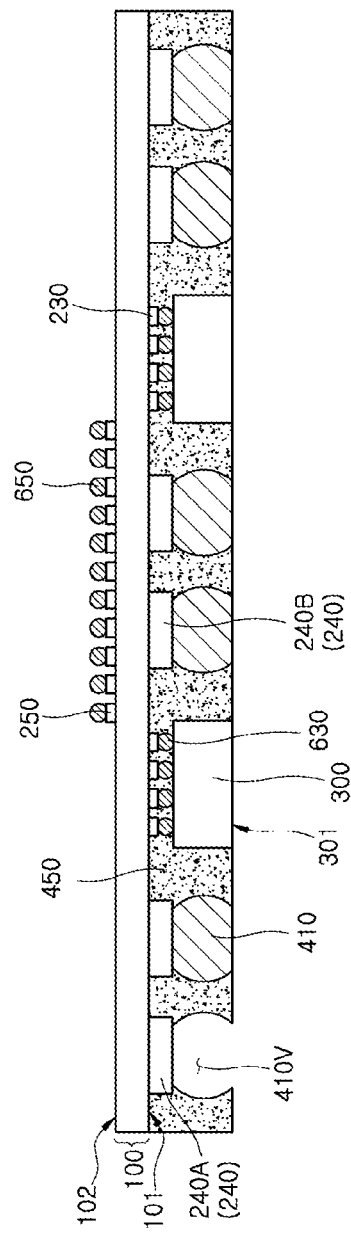
FIG. 22 is a cross-sectional view illustrating a defect of a general semiconductor package.

FIG. 22 is a cross-sectional view of a portion of a defective semiconductor package in the event that TMBCs 410 corresponding to the TMBCs 410B are formed of solder balls. Since the TMBCs 410 are disposed to substantially penetrate the molding layer 450, it may be important to prevent generation of defects while the molding layer 450 is formed.

If the TMBCs 410 are formed of solder balls, the solder balls may come out of the molding layer 450 when the outer connectors (420 of FIG. 20) are attached to the solder balls 410. The outer connectors (420 of FIG. 20) may be attached to the solder balls 410 using a solder reflow process. In such a case, the solder balls 410 may be melted and the molding layer 450 may be expanded. Thus, at least some of the solder balls 410 may undesirably come out of the molding layer 450 due to the heat generated by the solder reflow process and pressure applied to the solder balls 410. This is because the solder balls 410 containing a tin based solder material may have a relatively low melting point of about 220 degrees Celsius. If at least one of the solder balls 410 is removed, a void 410V may be provided in the molding layer 450.

The loss of the solder balls 410 may cause a connection failure of the solder balls 410. However, according to the embodiments, the TMBCs 410 may be formed of metal balls or solderless metal balls having a melting point which is higher than a melting point of a tin (Sn) material, and where solderless metal balls do not contain solder. Thus, it may prevent the void 410V from being formed in the molding layer 450. In some embodiments, the TMBCs 410 may be formed of metal balls having a melting point which is at least twice that of a tin (Sn) material. For example, each of the TMBCs 410 may be formed to include a copper ball. In such a case, the TMBCs 410 may also have a high electrical conductivity to reduce an electrical resistance of the TMBCs 410. The copper ball may be coated by a nickel layer or a nickel solder layer.

Figure 23:
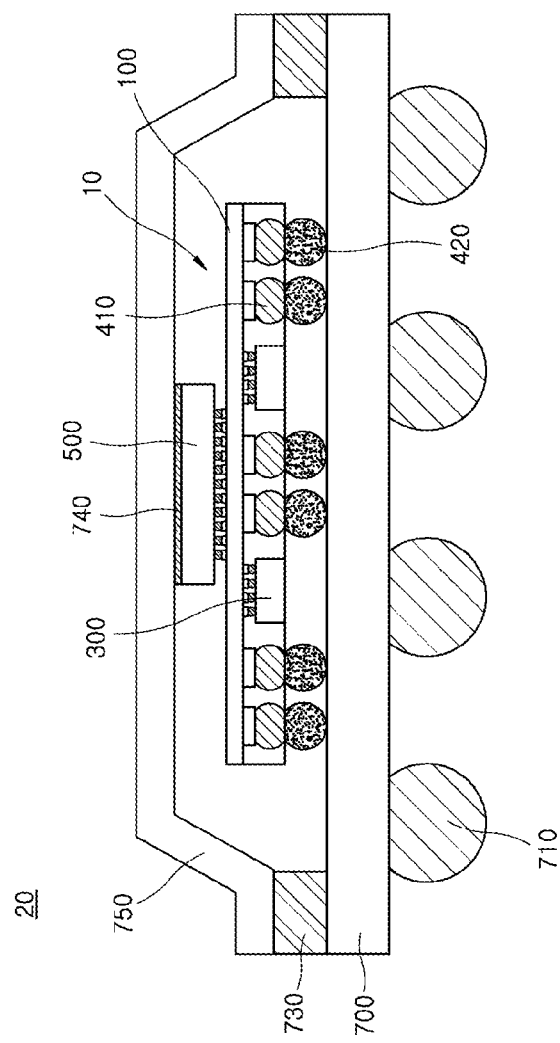
FIG. 23 is a cross-sectional view illustrating a semiconductor package according to another embodiment.

FIG. 23 is a cross-sectional view illustrating a semiconductor package 20 according to another embodiment. The semiconductor package 20 may be configured to include a package substrate 700 and the semiconductor package 10 (illustrated in FIGS. 19 and 20) mounted on the package substrate 700. The package substrate 700 may electrically connect the semiconductor package 10 to an electronic product. The package substrate 700 may include connectors 710 such as solder balls. The package substrate 700 may be a printed circuit board (PCB). The semiconductor package 20 may further include a heat spreader 750 attached to the second semiconductor device 500 using a thermal interface material layer 740. The heat spreader 750 may also be attached to the package substrate 700 using a stiffener 730. The semiconductor package 10 may be disposed in a space which is surrounded by the heat spreader 750, the stiffener 730 and the package substrate 700.

Figure 24:
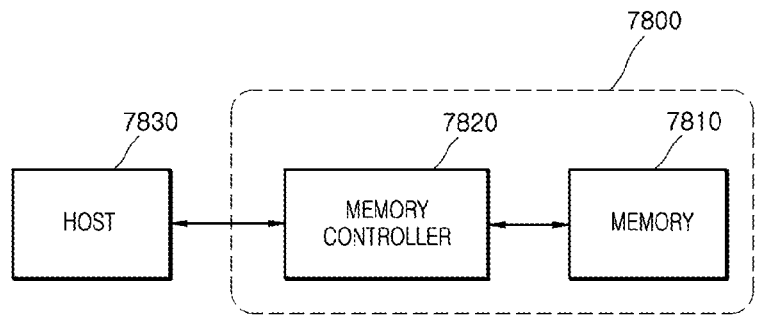
FIG. 24 is a block diagram illustrating an electronic system employing a memory card including at least one of packages according to some embodiments.

FIG. 24 is a block diagram illustrating an electronic system including a memory card 7800 including at least one semiconductor package according to an embodiment. The memory card 1800 includes a memory 7810, such as a nonvolatile memory device, and a memory controller 7820. The memory 7810 and the memory controller 7820 may store data or read stored data. The memory 7810 and/or the memory controller 7820 include at least one of the semiconductor packages according to some embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 25:
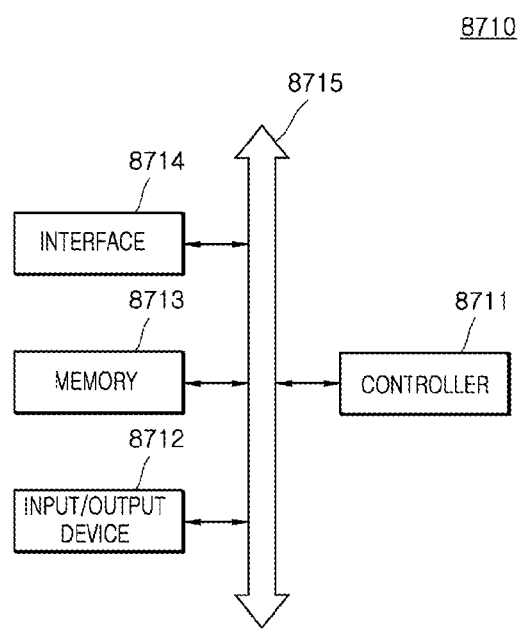
FIG. 25 is a block diagram illustrating an electronic system including at least one of packages according to some embodiments.

FIG. 25 is a block diagram illustrating an electronic system 8710 including at least one package according to an embodiment. The electronic system 8710 may include a controller 8711, an input/output device 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a first semiconductor device disposed on a first surface of an interconnection structure layer;
   through mold ball connectors (TMBCs) disposed on the first surface of the interconnection structure layer to be adjacent to the first semiconductor device;
   a molding layer disposed on the first surface of the interconnection structure layer to expose a portion of each of the through mold ball connectors (TMBCs);
   outer connectors attached to the exposed portions of the through mold ball connectors (TMBCs), respectively; and
   a second semiconductor device disposed on a second surface of the interconnection structure layer opposite to the first semiconductor device
   wherein the interconnection structure layer includes:
   a dielectric body;
   first vertical interconnection portions disposed in the dielectric body to electrically connect the first semiconductor device to the second semiconductor device;
   second vertical interconnection portions disposed in the dielectric body to electrically connect the second semiconductor device to some of the outer connectors; and
   horizontal interconnection portions disposed in the dielectric body to electrically connect the first semiconductor device to some others of the outer connectors.

2. The semiconductor package of claim 1, wherein the outer connectors connected to the second vertical interconnection portions are disposed to vertically overlap with the second semiconductor device.

3. The semiconductor package of claim 1, wherein the first semiconductor device is disposed to overlap with the second semiconductor device.

4. The semiconductor package of claim 3,
   wherein the interconnection structure layer is disposed between the first semiconductor device and the second semiconductor device; and
   wherein the interconnection structure layer includes first vertical interconnection portions electrically connecting the first semiconductor device to the second semiconductor device.

5. The semiconductor package of claim 1,
   wherein the second semiconductor device comprises a microprocessor; and
   wherein the first semiconductor device comprises a high bandwidth memory (HBM) device.

6. The semiconductor package of claim 1, wherein each of the through mold ball connectors (TMBCs) includes a solderless metal ball.

7. The semiconductor package of claim 6, wherein each of the through mold ball connectors (TMBCs) includes a copper ball.

8. The semiconductor package of claim 1, wherein the molding layer is disposed to expose a surface of the first semiconductor device.

9. The semiconductor package of claim 8, wherein the molding layer has a surface which is substantially coplanar with the exposed surface of the first semiconductor device.

10. The semiconductor package of claim 9, wherein each of the exposed portions of the through mold ball connectors (TMBCs) has a flat surface which is located at substantially the same level as the exposed surface of the first semiconductor device and the surface of the molding layer.

11. The semiconductor package of claim 1, further comprising:
    a package substrate attached to the outer connectors; and
    a heat spreader attached to the second semiconductor device using a thermal interface material layer,
    wherein the heat spreader extends to be attached to the package substrate.

12. A semiconductor package comprising:
    a first semiconductor device disposed on a first surface of an interconnection structure layer;
    through mold ball connectors (TMBCs) disposed on the first surface of the interconnection structure layer to be adjacent to the first semiconductor device, wherein each of the through mold ball connectors (TMBCs);
    a molding layer disposed on the first surface of the interconnection structure layer to expose a portion of each of the through mold ball connectors (TMBCs);
    outer connectors attached to the exposed portions of the through mold ball connectors (TMBCs), respectively;

a second semiconductor device disposed on a second surface of the interconnection structure layer opposite to the first semiconductor device;

first bump pads disposed on the second surface of the interconnection structure layer and connected to the second semiconductor device;

second bump pads disposed on the first surface of the interconnection structure layer and connected to the first semiconductor device; and third bump pads disposed on the first surface of the interconnection structure layer and connected to the through mold ball connectors (TMBCs), wherein the third bump pads have a thickness which is greater than a thickness of the second bump pads.

13. A memory card including a package, the package comprising:

a first semiconductor device disposed on a first surface of an interconnection structure layer;

through mold ball connectors (TMBCs) disposed on the first surface of the interconnection structure layer to be adjacent to the first semiconductor device;

a molding layer disposed on the first surface of the interconnection structure layer to expose a portion of each of the through mold ball connectors (TMBCs);

outer connectors attached to the exposed portions of the through mold ball connectors (TMBCs), respectively; and a second semiconductor device disposed on a second surface of the interconnection structure layer opposite to the first semiconductor device wherein the interconnection structure layer includes:

a dielectric body;

first vertical interconnection portions disposed in the dielectric body to electrically connect the first semiconductor device to the second semiconductor device;

second vertical interconnection portions disposed in the dielectric body to electrically connect the second semiconductor device to some of the outer connectors; and horizontal interconnection portions disposed in the dielectric body to electrically connect the first semiconductor device to some others of the outer connectors.

14. An electronic system including a package, the package comprising:

a first semiconductor device disposed on a first surface of an interconnection structure layer;

through mold ball connectors (TMBCs) disposed on the first surface of the interconnection structure layer to be adjacent to the first semiconductor device;

a molding layer disposed on the first surface of the interconnection structure layer to expose a portion of each of the through mold ball connectors (TMBCs);

outer connectors attached to the exposed portions of the through mold ball connectors (TMBCs), respectively; and a second semiconductor device disposed on a second surface of the interconnection structure layer opposite to the first semiconductor device wherein the interconnection structure layer includes:

a dielectric body;

first vertical interconnection portions disposed in the dielectric body to electrically connect the first semiconductor device to the second semiconductor device;

second vertical interconnection portions disposed in the dielectric body to electrically connect the second semiconductor device to some of the outer connectors; and horizontal interconnection portions disposed in the dielectric body to electrically connect the first semiconductor device to some others of the outer connectors.

* * * * *